(12) United States Patent
Bourgoin et al.

(10) Patent No.: US 6,667,658 B2
(45) Date of Patent: Dec. 23, 2003

(54) COMPACT VARIABLE GAIN AMPLIFIER

(75) Inventors: Jérôme Bourgoin, St Egrève (FR); Frédéric Goutti, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/020,010

(22) Filed: Dec. 13, 2001

(65) Prior Publication Data

US 2002/0097093 A1 Jul. 25, 2002

(30) Foreign Application Priority Data

Dec. 14, 2000 (FR) .......................................... 00 16318

(51) Int. Cl.[7] ................................................ H03F 3/45
(52) U.S. Cl. ........................ 330/255; 330/260; 330/261
(58) Field of Search .............................. 330/255, 256, 330/257, 260, 261, 292

(56) References Cited

U.S. PATENT DOCUMENTS

| | | | |
|---|---|---|---|
| 4,959,622 A | * 9/1990 | Kearney | ..................... 330/257 |
| 5,355,096 A | 10/1994 | Kobayashi | ................... 330/278 |
| 5,465,074 A | 11/1995 | Maschmann et al. | ........ 330/263 |
| 5,726,602 A | * 3/1998 | Brown | ........................ 330/255 |

OTHER PUBLICATIONS

Abstract on "Analog Integrated Circuits and Signal Processing" by Renirie et al.; vol. 8, 1995; pp. 37–48 XP–001019723.

* cited by examiner

*Primary Examiner*—Steven J. Mottola
(74) *Attorney, Agent, or Firm*—Lisa K. Jorgenson; Allen, Dyer, Doppelt, Milbrath & Gilchrist, P.A.

(57) ABSTRACT

An amplifier includes an input stage with one or more input terminals for receiving a signal to be amplified, and an output terminal. An inverting gain stage includes an input terminal connected to the output terminal of the input stage, an output terminal for delivering an amplified signal, and a variable feedback resistor connected between the output terminal and input terminal thereof. The input stage is a transconductor stage biased by a current source. A transconductance thereof is set by a resistor of the current source so that the amplifier has a gain proportional to the product of the variable feedback resistor multiplied by the transconductance.

39 Claims, 5 Drawing Sheets

COMPACT VARIABLE GAIN AMPLIFIER

FIELD OF THE INVENTION

The present invention relates to a compact variable gain amplifier. Such an amplifier may be applied in the audio field for sound recording or playing devices in telephony, and in particular, at the output of pick-up heads or microphones.

BACKGROUND OF THE INVENTION

Audio amplifiers must have a high gain and low noise because low signals must be amplified. This type of amplifier is generally made from at least two operational amplifiers connected in series via an attenuator for performing a compression function. The compression function allows the output signal amplitude to be reduced when the input signal amplitude increases too much.

FIG. 1 schematically shows such an amplifier. It represents two operational amplifiers A1, A2 connected in series as inverters through an attenuator A with a variable resistor R40. The operational amplifiers are parallel connected between two supply terminals. One terminal 1 is set to a high potential Vcc and the other terminal 2 is set to a low potential Vee, which is generally ground.

The inverting input of the first operational amplifier A1 receives the input signal Vi to be amplified through a resistor R10. The non-inverting input of the first operational amplifier A1 is set to a DC voltage, which is a fraction of the difference between potentials Vcc and Vee. A voltage divider, which in the example is composed of two resistors R, is connected between the two supply terminals 1, 2. In the example, it is assumed that Vee is ground and that the non-inverting input of the first amplifier A1 is set to Vcc/2 since the voltage divider resistors are equal.

The output of the first operational amplifier A1 is connected to its inverting input through a feedback resistor R20. The output of the first operational amplifier A1 is also connected to the input of attenuator A. The output of attenuator A drives the second operational amplifier A2 via the inverting input thereof. The non-inverting input of the second operational amplifier A2 is set to voltage Vcc/2 just like the first operational amplifier A1. Other voltages can be chosen by giving the voltage divider resistors other values.

The output of the second operational amplifier A2 is connected to the inverting input thereof through a variable feedback resistor R30. The amplifier gain is proportional to (R30×R10)/(R40×R20). The choice of the value of resistor R30 makes it possible to adjust the maximum amplifier gain. The output of the second operational amplifier A2 delivers an output signal Vo that is substantially a replica of input signal Vi after amplification.

The signal Vo is a variable component overlaid on a continuous component. The voltage applied to the non-inverting input of the second amplifier A2, which is Vcc/2 in the example, imposes the continuous component. The signal Vo is fed back at attenuator A. When the amplitude of Vi is too high, the value of the attenuator resistor R40 is increased to reduce the amplifier gain and thus the amplitude of Vo.

The attenuator is made from at least one diode (not shown) and, because of the diode, the attenuator does not operate in a perfectly linear way. The delivered signal Vo does not reflect input signal Vi very accurately for certain amplitudes. Also, the level of Vcc/2 cannot be kept perfectly constant when the operational amplifiers are operating.

A mute function may be obtained, but means or a circuit must be provided for disconnecting the input signal from the inverting input of the first operation amplifier. This is not easily implemented. Another disadvantage of the amplifier is size and consequently cost. Portable devices for recording and playing back sound, such as mobile phones, are becoming more miniaturized, their costs are ever decreasing and such amplifiers may be less interesting in such devices in the near future.

SUMMARY OF THE INVENTION

In view of the forgoing background, an object of the present invention is to solve such problems of small size, costs, lack of linearity and instability. A variable gain amplifier is proposed that is particularly compact and therefore usable in portable electric devices.

This and other objects, advantages and features according to the present invention are provided by an amplifier comprising an input stage with one or several input terminals for receiving a signal to be amplified, and an output terminal. An inverting gain stage with an input terminal is connected to the output terminal of the input stage. The amplifier further comprises an output terminal for delivering an amplified signal, and a variable feedback resistor connected between the output terminal and the input terminal thereof.

According to the invention, the input stage may be a transconductor stage biased by a current source. A resistor of the current source sets the transconductance in the transconductor stage. Thus, the amplifier may have a gain proportional to the product of the feedback resistor multiplied by the transconductance.

The amplifier is two to three times less bulky than the one previously described. The two amplifier stages are parallel connected between two supply terminals. For the output signal to have a variable continuous component, the gain stage may have another input terminal for receiving a variable DC voltage stabilized with respect to the supply terminal voltages. The input stage may have a long-tail pair of transistors. The current source will be made with transistors so as to deliver a current proportional to $V_T/R1$, where $V_T$ is a thermal voltage of $kT/q$, k is the Boltzmann constant, T is temperature, q is the electron charge and R1 is the resistor determining transconductance.

The gain stage may include a non-inverting long-tail pair of transistors with a non-inverting input terminal forming the input terminal of the gain stage, which is connected to the output terminal of the input stage, and an output terminal. The gain stage may further include an inverting stage with a pair of push-pull transistors and means or a circuit for class-AB biasing the transistors. An input terminal of the inverting stage may be connected to the output terminal of the long-tail pair of transistors of the gain stage. An output terminal forming the output terminal delivers the amplified signal. The feedback resistor is connected between the output terminal of the push-pull transistor inverter stage and the non-inverting input terminal.

According to an alternate embodiment, the gain stage may include an inverting long-tail pair of transistors with an inverting input terminal forming the input terminal of the gain stage, which is connected to the output terminal of the input stage, and an output terminal. The gain stage may further include a tracking stage with a tracking transistor biased by a current source, which is connected to the output terminal of the inverting long-tail pair of transistors, and an output terminal forming the output terminal for delivering the amplified signal. The feedback resistor is connected between the output terminal of the tracking stage and the inverting input terminal. The long-tail pair of transistors of the gain stage may include another input terminal forming the input terminal of the gain stage receiving the variable DC voltage.

Another object of the invention is to provide the amplifier with a compression function and/or a mute function. The biasing source of the input stage may be equipped with means or a circuit for totally or partially bypassing the current delivered thereby. The bypass means may have a long-tail pair of transistors biased by a current source. This long-tail pair has a non-inverting input terminal for receiving a bypass control voltage, an inverting input terminal for receiving a threshold voltage, and an output terminal connected to the current source of the input stage.

BRIEF DESCRIPTION OF THE DRAWINGS

Other features and advantages of the invention will be apparent from the following description, with reference to the figures of the appended drawings. The description is only illustrative and is not to be restrictive.

DETAILED DESCRIPTION OF THE PREFERRED EMBODIMENTS

Figure 1:
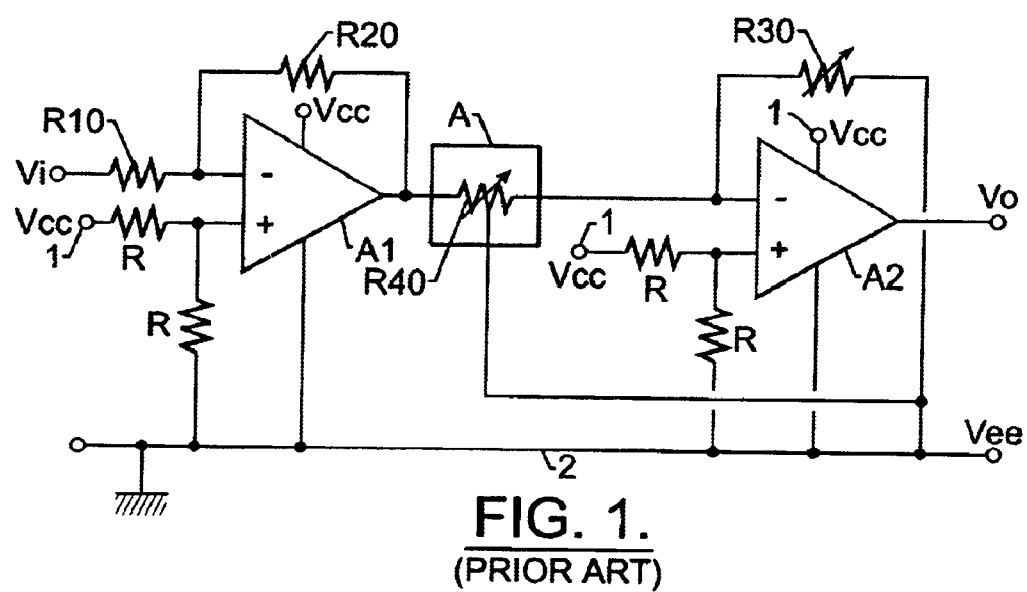
FIG. 1 is a circuit diagram of an amplifier according to the prior art.
Figure 2:
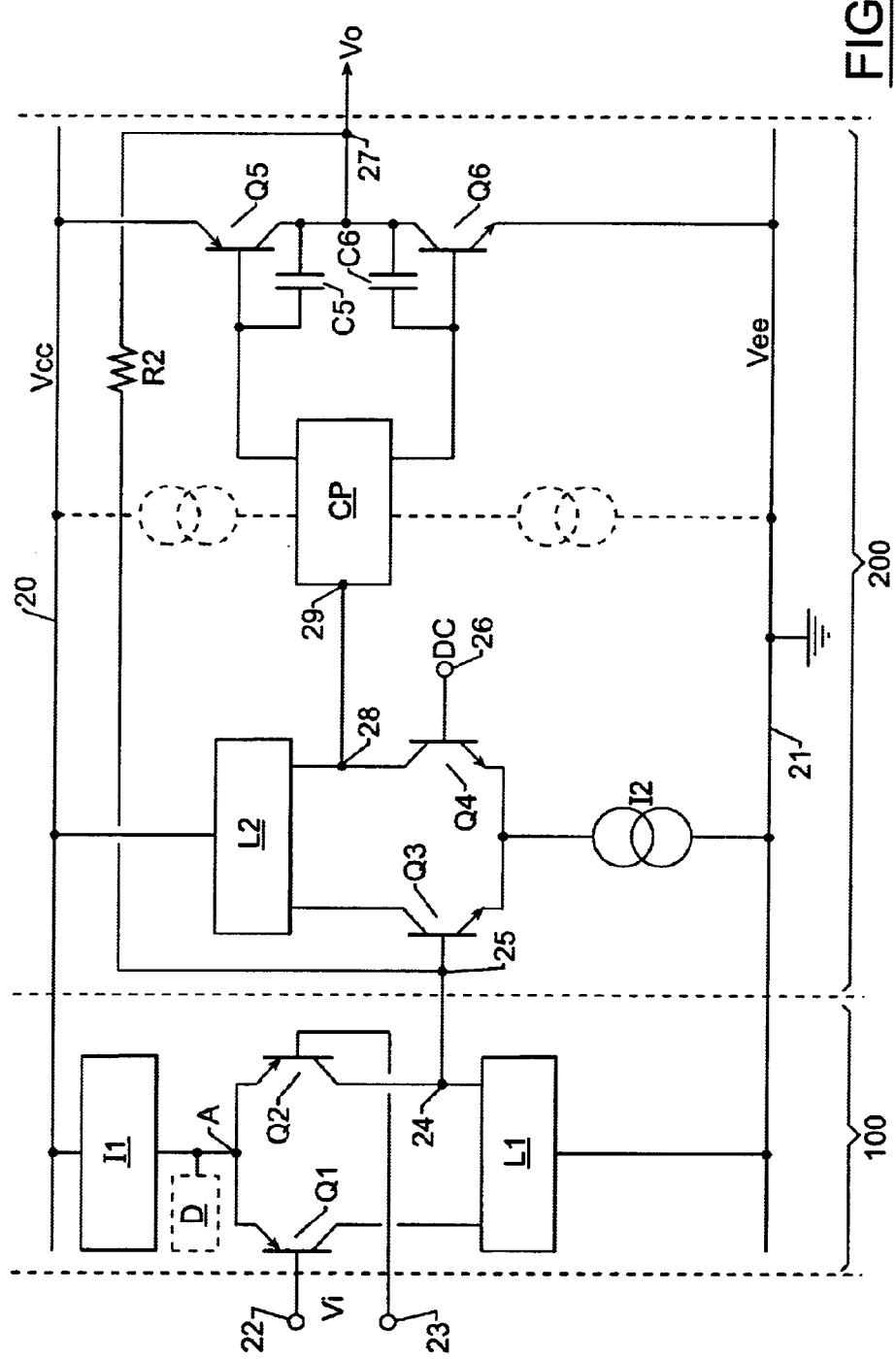
FIG. 2 is a circuit diagram of a sample embodiment of an amplifier in accordance with the invention.

FIG. 2 represents a sample amplifier in accordance with the invention. The amplifier is connected between two supply terminals. One terminal 20 is set to high potential Vcc, and the other terminal 21 is set to low potential Vee, which is generally ground.

The amplifier includes an input stage 100 composed of a first non-inverting long-tail pair of transistors Q1, Q2 biased by a current source I1. The transistors are bipolar transistors of the same type and their emitters are connected in common. The bases of transistors Q1, Q2 are the differential input terminals 22, 23 of input stage 100. The signal to be amplified Vi is applied between these two input terminals 22, 23. It is also possible to use only one of the input terminals and set the other input terminal to a predetermined potential with respect to potentials Vcc and Vee.

A load L1 is connected between the collectors of transistors Q1, Q2, and supply terminal 21 is set to the low potential Vee. The current source I1 is connected between point A, common to both emitters, and supply terminal 20 is set to the high potential Vcc. In the example, transistors Q1, Q2 of the long-tail pair are PNP transistors. They could be replaced by NPN transistors by making all the required inversions at current source I1 and load L1.

According to one feature of the invention, the input stage 100 is a transconductor stage. A transconductor stage has a current output terminal 24 at the collector of transistor Q2. The terminal delivers a current proportional to the difference of potentials applied between both differential input terminals 22, 23 thereof. The following relation provides the transconductance Gm of the transconductor stage: $Gm = I2/V_T$, where I2 represents the collector current in transistor Q2, $V_T$ is a thermal voltage defined by $V_T = kT/q$, k is the Boltzmann constant, T is the temperature, and q is the electron charge.

Figure 3A:
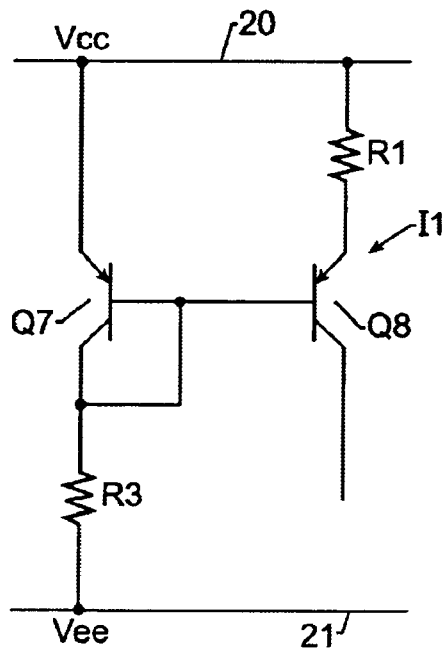
FIGS. 3A and 3B are respective circuit diagrams of sample embodiments of the biasing sources of the input stage long-tail pair and the gain stage long-tail pair of the amplifier of FIG. 2.

The current source I1 delivers a current $I1 = V_T/R1$. FIG. 3A represents a diagram of such a current source. The source is known as a Widlar source. It includes two bipolar transistors Q7, Q8 of the same type (PNP transistors in this case), the bases of which are connected in common. The emitter of transistor Q7 is connected to supply terminal 20, which is set to the high potential Vcc. The collector of transistor Q7 is connected to supply terminal 21, which is set to the low potential Vee through a resistor R3. Transistor Q7 is diode-connected, that is, the collector and base thereof are connected in common.

The emitter of transistor Q8 is connected to supply terminal 20, which is set to the high potential Vcc through a resistor R1. The collector of transistor Q8 is connected to common point A. With such a current source I1, the transconductor input stage 100 has a transconductance of $Gm = I2/V_T$, with $I2 = I1/2$. As $I1 = V_T/R1$, $Gm = 1/2R1$ is thus obtained.

The load L1, which is connected between the collectors of the two transistors Q1, Q2 of the long-tail pair, can be passive and composed of resistors each connected between the collector of one of the transistors and the supply terminal 21, which is set to the low potential Vee. Preferably, load L1 will be active so as to obtain a differential voltage gain greater than the one obtained with a non-reactive load.

Figure 4A:
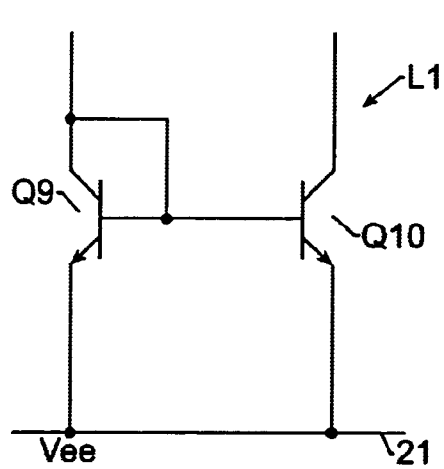
FIGS. 4A and 4B are respective circuit diagrams of sample embodiments of loads associated with the input stage long-tail pair and the gain stage long-tail of the amplifier of FIG. 2.

An example of a frequently used active load is a current mirror, which is illustrated in FIG. 4A. The active load has one pair of bipolar transistors Q9, Q10 of the same type (NPN in this case) with a common base. Transistor Q9 is diode-connected, with the base and collector being connected together. The collector is connected to the collector of transistor Q1. The emitter is connected to the supply terminal 21, which is set to the low potential Vee. The collector of transistor Q10 is connected to the collector of transistor Q2, and the emitter is connected to the supply terminal 21.

The current delivered by the transconductor input stage 100 is fed into an inverting gain stage 200, which will yield an amplified and inverted replica of the input signal Vi. This gain stage 200 is a differential feedback stage with two input terminals 25 and 26, and one output terminal 27. The current output terminal 24 of the input stage 100 is connected to the first input terminal 25 of the gain stage 200.

The second input terminal 26 is set to a variable direct voltage DC stabilized with respect to the two supply potentials Vee and Vcc. This direct voltage DC can be delivered by a direct voltage generator external the amplifier, by a voltage generator internal the amplifier, or by a circuit connected to the supply terminals 20, 21 for providing the required stability.

The direct voltage DC provides the continuous component of the amplified output signal Vo existing at the output terminal 27 of the gain stage 200. The level of this voltage is variable, so that the output level of the output signal can be regulated. The differential amplifier also has a feedback resistor R2 connected between output terminal 27 and first input terminal 25. The resistor R2 is variable and enables voltage gain-regulation of the amplifier, which is proportional to the ratio R2/R1.

We are now going to examine an embodiment of the gain stage 200. The gain stage 200 has a non-inverting long-tail pair of transistors Q3, Q4 composed of two bipolar transistors of the same type (NPN in this case) biased by a current source I2 and connected to a load L2. Both transistors Q3, Q4 are connected together via their emitters. The base of transistor Q3 is the first input terminal 25 of gain stage 200. This is the non-inverting terminal of the long-tail pair Q3, Q4. The base of transistor Q4 is the second input terminal 26 of gain stage 200. This is the inverting terminal of the long-tail pair Q3, Q4. Current source I2 is connected between the emitters of transistors Q3, Q4 of the pair and supply terminal 21, which is set to the low potential Vee.

Figure 3B:
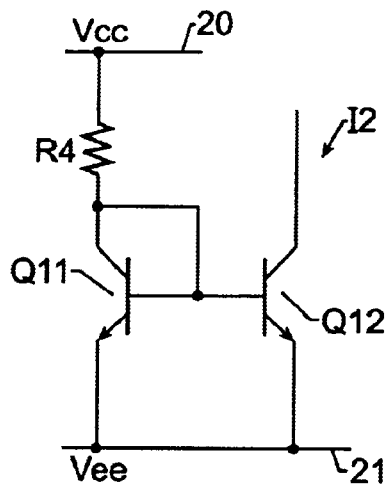

FIG. 3B illustrates a sample embodiment of current source I2. The current source is of the current mirror type, which is conventional. It has two bipolar transistors Q11, Q12 of the same type (NPN in this case), the bases of which are connected together. Transistor Q11 is diode-connected, that is, the collector is connected to the base. The collector is also connected through a resistor R4 to supply terminal 20, which is set to the high potential Vcc. The emitter is connected to supply terminal 21, which is set to the low potential Vee. The collector of transistor Q12 is connected to the emitters of transistors Q3 and Q4 of the long-tail pair. The emitter is connected to supply terminal 21.

Figure 4B:
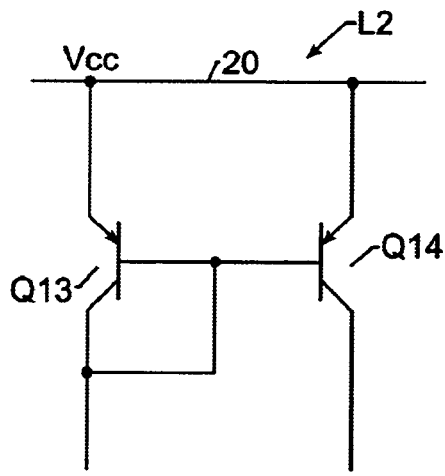

Just like load L1, load L2 can be a non-reactive load, but an active load for maximizing the voltage gain will be preferred thereto. A sample embodiment of load L2 is illustrated in FIG. 4B. The active load has a pair of bipolar transistors Q13, Q14 of the same type (PNP in this case) with a common base.

Transistor Q13 is diode-connected, that is, the base and collector are connected together. The collector is connected to the collector of transistor Q3. The emitter is connected to supply terminal 20. The collector of transistor Q14 is connected to the collector of transistor Q4 and the emitter is connected to supply terminal 20. The long-tail pair Q3, Q4 has an output terminal 28 at the collector of transistor Q4. The terminal is connected to a class AB driven and biased push-pull inverting stage. The push-pull stage has a pair of complementary bipolar transistors Q5, Q6.

Transistor Q5 is a PNP type. The emitter is connected to supply terminal 20 and the collector is connected to the collector of the other transistor Q6 of the push-pull stage. Transistor Q6 is an NPN type and the emitter is connected to supply terminal 21. The bases of the two transistors Q5 and Q6 are biased and driven by a class AB control circuit CP, known as such. The control circuit CP is connected to the output terminal 28 of the long-tail pair Q3, Q4 and is biased by current sources represented with dotted lines.

The advantage of the operation of this class AB stage is that there is no power consumption when no signal is applied to the input. This is particularly interesting in telephone applications where the input voice signal is intermittent and the power supply is provided via batteries. The structure also has the advantage of reducing heat dissipation at the transistor level, which allows its life to be increased and the circuit to be miniaturized.

A more detailed description of class AB control circuits is given, e.g., in the article "Parallel Feedward Class-AB Control Circuits for Low-Voltage Bipolar Rail-to-Rail Output Stages of Operational Amplifiers", by W. C. M Renirie et al. *Analog Integrated Circuits and Signal Processing* 8, 37–48 (1995). References C5 and C6 designate frequency compensating capacitors, usually called Miller capacitances, respectively connected between the bases and collectors of transistors Q5 and Q6 of the push-pull stage.

The variable feedback resistor R2 is connected between output terminal 27, which is the common point of the collectors of transistors Q5 and Q6, and input terminal 25, which is the non-inverting input terminal of the long-tail pair Q3, Q4. With such a circuit, the inventive amplifier gain is thus proportional to the ratio R2/2R1 and regulating the value of R2 allows adjustment of the gain. Instead of making the inversion at the push-pull stage, it can also be made at the long-tail pair.

Figure 7:
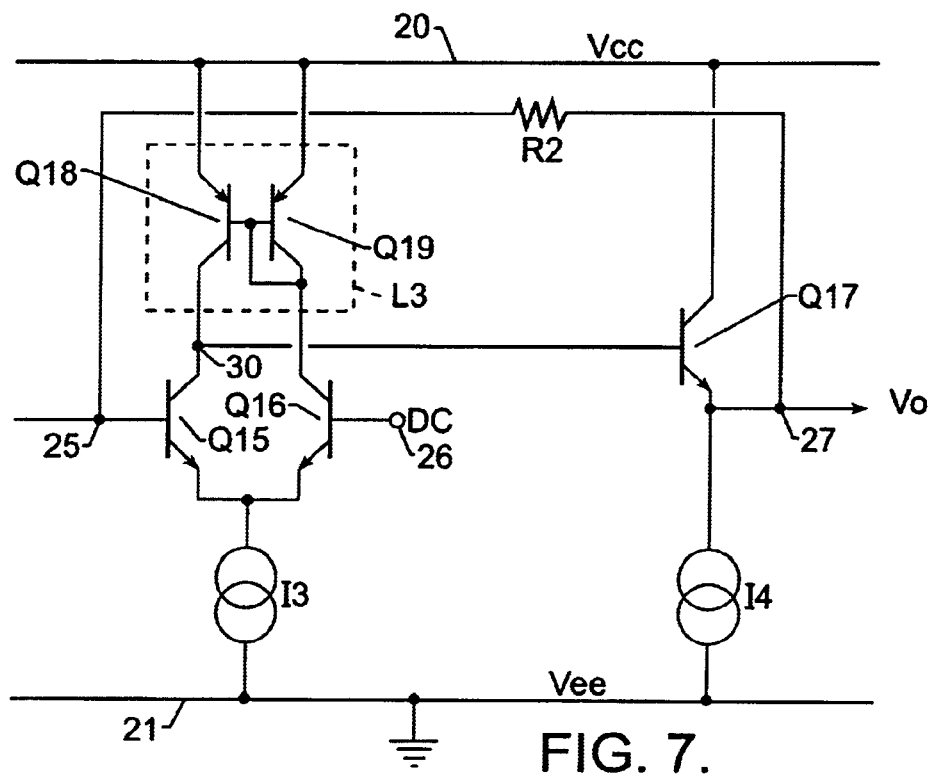
FIG. 7 is a circuit diagram of an alternate embodiment of the gain stage according to the present invention.

FIG. 7 shows another configuration for gain stage 200. The gain stage 200 has an inverting long-tail pair of transistors Q15, Q16 composed of two bipolar transistors of the same type (NPN in this case) biased by a current source I3 and connected to a load L3. Both transistors Q15, Q16 are connected together via their emitters. The base of transistor Q15 is the first input terminal 25 of the gain stage 200. This is the inverting input of the long-tail pair of transistors. The base of transistor Q16 is connected to the second input terminal 26 of gain stage 200. This is the non-inverting input of the long-tail pair of transistors. The long-tail pair of transistors Q15, Q16, which is now inverting, has an output terminal 30 at the collector of transistor Q15. Current source I3 is connected between the emitters of the transistors Q15, Q16 of the pair and supply terminal 21 is set to the low potential Vee. It can be the same as the source I2 illustrated in FIG. 3B.

Just like loads L1, L2, load L3 can be resistive, but an active load like the illustrated one will be preferred. It has a pair of bipolar transistors Q18, Q19 of the same type (PNP in this case) with a common base. The collector of transistor Q18 is connected to the collector of transistor Q15 and the emitter is connected to supply terminal 20. Transistor Q19 is diode-connected, that is, the base and collector are connected together. The collector is connected to the collector of transistor Q16. The emitter is connected to supply terminal 20. The output terminal 30 of the inverting long-tail pair Q15, Q16 is connected to a tracking stage.

The tracking stage has a transistor Q17, which in this example is of the NPN-type. It is biased by a current source 14. The collector is connected to the supply terminal 20. The base is connected to output terminal 29. Current source 14 is connected between the emitter of transistor Q17 and supply terminal 21 is set to low potential Vee. It can be of the same kind as current sources I3 or I2, with the latter being illustrated in FIG. 3B.

The variable feedback resistor R2 is connected between the output terminal 27 connected to the emitter of tracking transistor Q17 and input terminal 25. Although the stage including transistor Q17 is a tracking stage, the correct choice of transistors Q15, Q16, Q18, Q19 allows the gain stage 200 of this configuration to be substantially equivalent in terms of performance to the one represented in FIG. 2. It is also easier to make. A compression function may be obtained by bypassing a biasing current delivered by source I1. For this purpose, FIG. 2 simplifies the bypass means D inserted between the current source I1 at $V_T/R1$ and node A common to the emitters of transistors Q1 and Q2.

Figure 8:
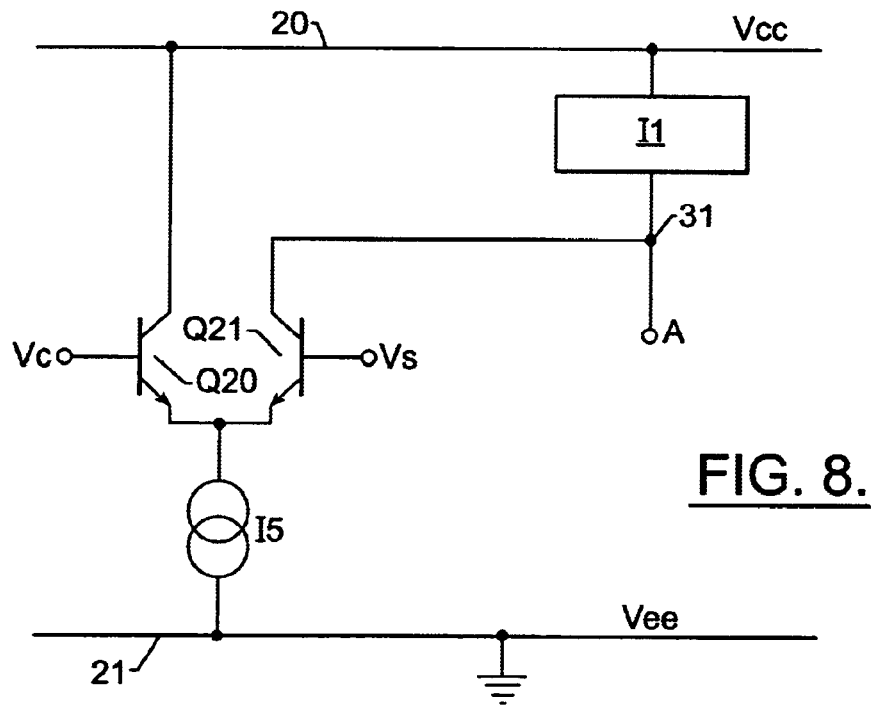
FIG. 8 is a circuit diagram of a sample embodiment of the bypass means according to the present invention.

FIG. 8 illustrates an embodiment of bypass means D. It has a long-tail pair of transistors Q20, Q21 biased by a current source I5. In the example, the transistors of the pair are bipolar transistors of the same type, NPN-type in this case, with common emitters. A current source I5 is connected between the common point of the emitters of transistors Q20, Q21 and supply terminal 21 is set to the low potential Vee. Supply source I5 can be of the same kind as current source I2.

The long-tail pair of transistors has a non-inverting input terminal, at the base of transistor Q20, for receiving at a control voltage Vc of the compression function. The long-tail pair of transistors include an inverting input terminal at the base of transistor Q21 for receiving a threshold voltage Vs. The collector of transistor Q20 is connected to supply terminal 20 which is set to the high potential Vcc. The long-tail pair of transistors has an output terminal 31., at the collector of transistor Q21, connected to current source I1, at common point A located between current source I1 and the emitters of the long-tail pair of transistors Q1, Q2.

When control voltage Vc is greater than the threshold voltage Vs, all of the current of source I5 goes into transistor Q20. There is no bypassing. On the contrary, when control voltage Vc is less than the threshold voltage Vs, part of the current from source I5 goes through transistor Q21 from point A. Here, there is bypassing. The bypass means D also allows a mute function to be achieved, by totally bypassing the biasing current I1 of current source I1. To provide the mute function, a value of current I5 of current source I5 greater than that of current I1 and a value Vs-Vc sufficiently great for bypassing all of current I1 are chosen.

Figure 5:
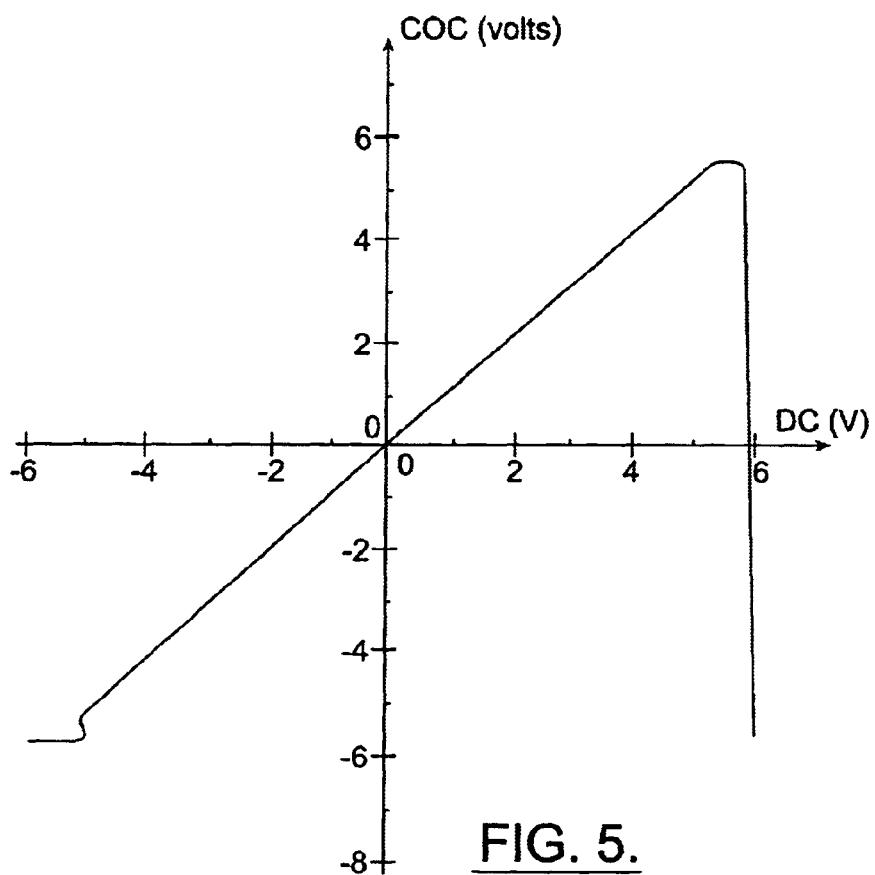
FIG. 5 is a graph representing the fluctuation of the continuous component of the amplifier output signal of a FIG. 2 as a function of stabilized variable DC voltage.

In the example described, all transistors have been simplified as bipolar transistors. It is quite possible to replace them with field effect transistors. It is also possible to replace all bipolar transistors with their complements by adequately modifying their connections. FIG. 5 shows the variations of the continuous component COC of the output signal Vo as a function of the voltage DC applied to the base of transistor Q4 of the long-tail pair of gain stage 200. It appears that the variation of the continuous component is linear for a large voltage range.

Figure 6:
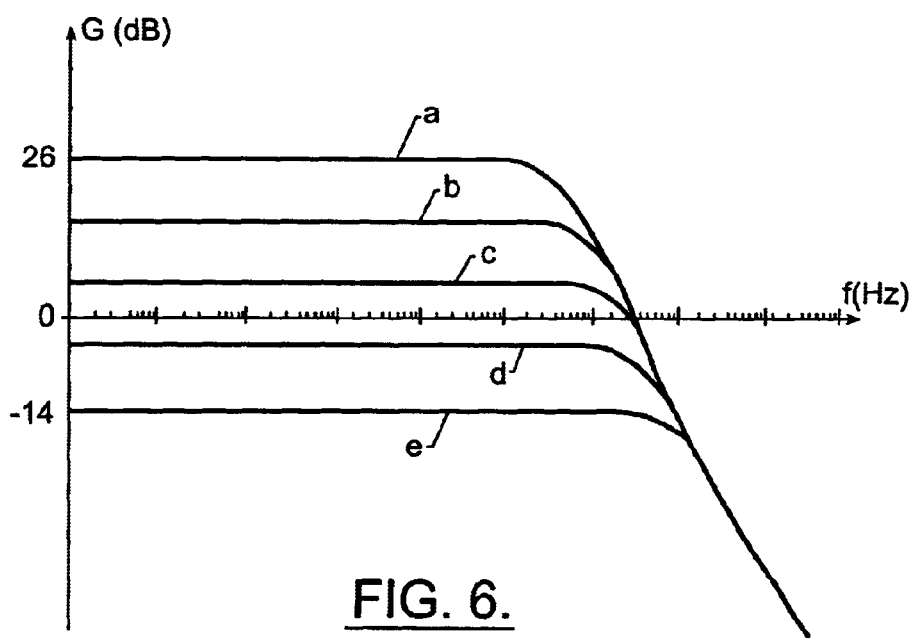
FIG. 6 is a graph representing the gain amplitude of the amplifier of FIG. 2, as a function of frequency, for different values of resistor R2.

FIG. 6 is a representation of the amplitude G of the amplifier gain in decibels as a function of the frequency in hertz using a logarithmic scale for different values of resistor R2. It is assumed that the current of current source I1 is 100 microamperes. Resistor R2 is $12*10^n$ with n varying from 3 to 1 in increments of 0.5. The curves referenced from a to e compose a set with a common part. They correspond to values of resistor R2 within 12 k_ (curve a) and 120_ (curve e.). This set of curves which is linear for a large frequency range is quite comparable with the one delivered by a prior art amplifier.

What is claimed is:

1. An amplifier comprising:
    a transconductance input stage comprising at least one input terminal for receiving a signal to be amplified, and an output terminal; and
    an inverting gain stage comprising a first input terminal connected to the output terminal of said transconductance input stage, an output terminal for delivering an amplified signal, and a feedback resistor connected between the input and output terminals thereof;
    said transconductance input stage comprising
        a first current source including a resistor for determining a transconductance of said transconductor input stage so that a gain of the amplifier is proportional to a product of said feedback resistor and the transconductance, and
        a bypass circuit connected to said first current source for restricting current flow therefrom.

2. An amplifier according to claim 1, wherein said input stage comprises a first pair of transistors connected to said first current source.

3. An amplifier according to claim 1, wherein said first current source comprises at least one transistor for providing a current proportional to $V_t/R1$, where $V_t$ is a thermal voltage of kT/q with k being Boltzman'S constant, T being temperature, q being an electron charge, and R1 being said resistor for determining the transconductance.

4. An amplifier according to claim 3, wherein said first current source comprises a Widlar current source.

5. An amplifier according to claim 2, wherein said transconductance input stage further comprises a first load connected to said first pair of transistors.

6. An amplifier according to claim 5, wherein said first load comprises a current mirror.

7. An amplifier according to claim 1, wherein said transconductance input stage and said inverting gain stage are connected together in parallel between two voltage supplies; and wherein aid inverting gain stage comprises a second input terminal for receiving a direct current voltage.

8. An amplifier according to claim 1, wherein said inverting gain stage comprises:
    a second pair of transistors having a non-inverting input terminal forming the input terminal of said inverting gain stage, the non-inverting input terminal being connected to the output terminal of said transconductance input stage and to said feedback resistor; and
    an inverting circuit comprising an input terminal connected to an output terminal of said second pair of transistors, and an output terminal connected to said feedback resistor, said inverting circuit comprising
        a third pair of transistors having an output terminal connected to said feedback resistor, and
        a control circuit for biasing said third pair of transistors, and comprising an input terminal connected to the output terminal of said second pair of transistors, and an output terminal connected to said third pair of transistors for biasing thereof.

9. An amplifier according to claim 8, wherein said control circuit is configured as a class-AB bias circuit.

10. An amplifier according to claim 8, wherein said second pair of transistors has a second input terminal for receiving a direct current voltage.

11. An amplifier according to claim 8, wherein said inverting gain stage comprises a second load connected to said second pair of transistors.

12. An amplifier according to claim 11, wherein said second load comprises a current mirror.

13. An amplifier according to claim 8, wherein said inverting gain stage comprises a second current source for biasing said second pair of transistors.

14. An amplifier according to claim 8, wherein said inverting circuit further comprises a pair of capacitors connected to said third pair of transistors.

15. An amplifier according to claim 1, wherein said inverting gain stage comprises:
    a second pair of transistors having an inverting input terminal forming the input terminal of said inverting gain stage, the inverting input terminal being connected to the output terminal of said transconductance input stage and to said feedback resistor; and
    a tracking stage comprising an input terminal connected to the output terminal of said second pair of transistors, and an output terminal connected to said feedback resistor for providing the amplified signal thereto, said tracking stage comprising a tracking transistor, and a second current source connected to said tracking transistor for biasing thereof.

16. An amplifier according to claim 15, wherein said second pair of transistors has a second input terminal for receiving a direct current voltage.

17. An amplifier according to claim 15, wherein said inverting gain stage comprises a second load connected to said second pair of transistors.

18. An amplifier according to claim 15, wherein said inverting gain stage comprises a second current source for biasing said second pair of transistors.

19. An amplifier according to claim 1, wherein said bypass circuit comprises a first input terminal for receiving a bypass control voltage, a second input terminal for receiving a threshold voltage, and an output terminal connected to said first current source, said bypass circuit comprising a fourth pair of transistors and a current source for biasing thereof.

20. An amplifier comprising:
   a transconductance input stage comprising at least one input terminal for receiving a signal to be amplified, an output terminal, and a first pair of transistors; and
   an inverting gain stage comprising a first input terminal connected to the output terminal of said transconductance input stage, an output terminal for delivering an amplified signal, said inverting gain stage comprising
      a feedback resistor connected between the input and output terminals thereof,
      a second pair of transistors having a non-inverting input terminal forming the input terminal of said inverting gain stage, the non-inverting input terminal being connected to the output terminal of said transconductance input stage and to said feedback resistor,
      a second current source for biasing said second pair of transistors, and
      an inverting circuit comprising an input terminal connected to an output terminal of said second pair of transistors, an output terminal connected to said feedback resistor, and a third pair of transistors having an output terminal connected to said feedback resistor;
   said transconductance input stage comprising a first current source connected to said first pair of transistors, and comprising a resistor for determining a transconductance of said transconductor input stage so that a gain of the amplifier is based upon said feedback resistor and the transconductance.

21. An amplifier according to claim 20, wherein the gain of the amplifier is proportional to a product of said feedback resistor and the transconductance.

22. An amplifier according to claim 20, further comprising a control circuit for biasing said third pair of transistors, and having an input terminal connected to the output terminal of said second pair of transistors, and an output terminal connected to said third pair of transistors for biasing thereof.

23. An amplifier according to claim 20, wherein said transconductance input stage and said inverting gain stage are connected together in parallel between two voltage supplies, said inverting gain stage comprising a second input terminal for receiving a direct current voltage.

24. An amplifier according to claim 20, wherein said inverting circuit further comprises a pair of capacitors connected to said third pair of transistors.

25. An amplifier according to claim 20, wherein said transconductance input stage further comprises a bypass circuit connected to said first current source for restricting current flow therefrom.

26. An amplifier according to claim 25, wherein said bypass circuit has a first input terminal for receiving a bypass control voltage, a second input terminal for receiving a threshold voltage, and an output terminal connected to said first current source, said bypass circuit comprising a fourth pair of transistors and a current source for biasing thereof.

27. An amplifier comprising:
   a transconductance input stage comprising at least one input terminal for receiving a signal to be amplified, an output terminal, and a first pair of transistors; and
   an inverting gain stage comprising a first input terminal connected to the output terminal of said transconductance input stage, an output terminal for delivering an amplified signal, said inverting gain stage comprising
      a feedback resistor connected between the input and output terminals thereof,
      a second pair of transistors having a non-inverting input terminal forming the input terminal of said inverting gain stage, the non-inverting input terminal being connected to the output terminal of said transconductance input stage and to said feedback resistor, and
      a tracking transistor comprising an input terminal connected to the output terminal of said second pair of transistors, and an output terminal connected to said feedback resistor;
   said transconductance input stage comprising a first current source connected to said first pair of transistors, and comprising a resistor for determining a transconductance of said transconductor input stage so that a gain of the amplifier is based upon said feedback resistor and the transconductance.

28. An amplifier according to claim 27, wherein the gain of the amplifier is proportional to a product of said feedback resistor and the transconductance.

29. An amplifier according to claim 27, said inverting gain stage further comprising a second current source connected to said tracking transistor for biasing thereof.

30. An amplifier according to claim 27, wherein said transconductance input stage and said inverting gain stage are connected together in parallel between two voltage supplies, said inverting gain stage comprising a second input terminal for receiving a direct current voltage.

31. An amplifier according to claim 27, wherein said inverting gain stage comprises a second current source for biasing said second pair of transistors.

32. An amplifier according to claim 27, wherein said transconductance input stage further comprises a bypass circuit connected to said first current source for restricting current flow therefrom.

33. An amplifier according to claim 32, wherein said bypass circuit has a first input terminal for receiving a bypass control voltage, a second input terminal for receiving a threshold voltage, and an output terminal connected to said first current source, said bypass circuit comprising a fourth pair of transistors and a current source for biasing thereof.

34. A method for making an amplifier comprising:
   forming a transconductance input stage comprising at least one input terminal for receiving a signal to be amplified, and an output terminal;
   forming an inverting gain stage comprising a first input terminal connected to the output terminal of the input stage, and an output terminal for delivering an amplified signal; and connecting a feedback resistor between the input and output terminals of the inverting gain stage;

the transconductance input stage comprising a first current source comprising a resistor for determining a transconductance of the transconductor input stage so that a gain of the amplifier is proportional to a product of the feedback resistor and the transconductance, and a bypass circuit connected to the first current source for restricting current flow therefrom.

35. A method according to claim 34, wherein forming the transconductance input stage comprises connecting a first pair of transistors to the first current source.

36. A method according to claim 34, further comprising connecting the transconductance input stage and the inverting gain stage together in parallel between two voltage supplies, with the inverting gain stage comprising a second input terminal for receiving a direct current voltage.

37. A method according to claim 35, wherein forming the inverting gain stage comprises:

a second pair of transistors having a non-inverting input terminal forming the input terminal of the inverting gain stage, the non-inverting input terminal being connected to the output terminal of the input stage and to the feedback resistor; and an inverting circuit comprising an input terminal connected to an output terminal of the second pair of transistors, and an output terminal connected to the feedback resistor, the inverting circuit comprising a third pair of transistors having an output terminal connected to the feedback resistor for providing the amplified signal thereto, and a control circuit for biasing the third pair of transistors, and having an input terminal connected to the output terminal of the second pair of transistors, and an output terminal connected to the third pair of transistors for biasing thereof.

38. A method according to claim 37, further comprising connecting a pair of capacitors to the third pair of transistors.

39. A method according to claim 34, wherein forming the inverting gain stage comprises:

a second pair of transistors comprising an inverting input terminal forming the input terminal of the inverting gain stage, the inverting input terminal being connected to the output terminal of the input stage and to the feedback resistor; and a tracking stage having an input terminal connected to the output terminal of the second pair of transistors, and an output terminal connected to the feedback resistor, the tracking stage comprising a tracking transistor, and a second current source connected to the tracking transistor for biasing thereof.

* * * * *

UNITED STATES PATENT AND TRADEMARK OFFICE
CERTIFICATE OF CORRECTION

PATENT NO. : 6,667,658 B2  
DATED : December 23, 2003  
INVENTOR(S) : Jérôme Bourgoin, and Frédéric Goutti It is certified that error appears in the above-identified patent and that said Letters Patent is hereby corrected as shown below:

<u>Column 6,</u>
Lines 48 and 49, delete "14" insert -- I4 --

<u>Column 8,</u>
Line 9, delete "Boltzman'S" insert -- Boltzman's --

Signed and Sealed this

Twenty-fifth Day of May, 2004

JON W. DUDAS
*Acting Director of the United States Patent and Trademark Office*